United States Patent [19]

Gunnarsson

[11] Patent Number: 4,604,587

[45] Date of Patent: Aug. 5, 1986

[54] TUNABLE MAGNETRON WITH INTERNAL TUNING MOTOR

[75] Inventor: Tord S. Gunnarsson, Järfälla, Sweden

[73] Assignee: U.S. Philips Corporation, New York, N.Y.

[21] Appl. No.: 636,536

[22] Filed: Aug. 1, 1984

[30] Foreign Application Priority Data

Aug. 5, 1983 [SE] Sweden ............................... 8304289

[51] Int. Cl.[4] ............................................ H03B 9/100

[52] U.S. Cl. ....................................... 331/90; 331/96; 315/39.55; 315/39.61

[58] Field of Search ................. 331/86, 90, 96, 177 R; 315/39.51, 39.55, 39.61, 39.71; 333/224, 232, 235

[56] References Cited

U.S. PATENT DOCUMENTS

| | | | |
|---|---|---|---|
| 3,379,925 | 4/1968 | Edwards | 331/90 X |
| 3,435,284 | 3/1969 | Downing et al. | 331/90 X |
| 3,441,796 | 4/1969 | Cooper | 331/90 X |
| 3,904,919 | 9/1975 | Farney et al. | 331/90 X |

*Primary Examiner*—Eugene R. LaRoche
*Assistant Examiner*—Robert J. Pascal
*Attorney, Agent, or Firm*—David R. Treacy

[57] ABSTRACT

A rotatable tuning body is driven by a positioning motor such as a stepper motor, for varying the tuning frequency of a magnetron. The motor rotor is situated within the evacuated space of the magnetron and is integrated with the tuning body. The motor stator is fixed to the magnetron envelope, and preferably forms part of the vacuum-tight envelope.

4 Claims, 1 Drawing Figure

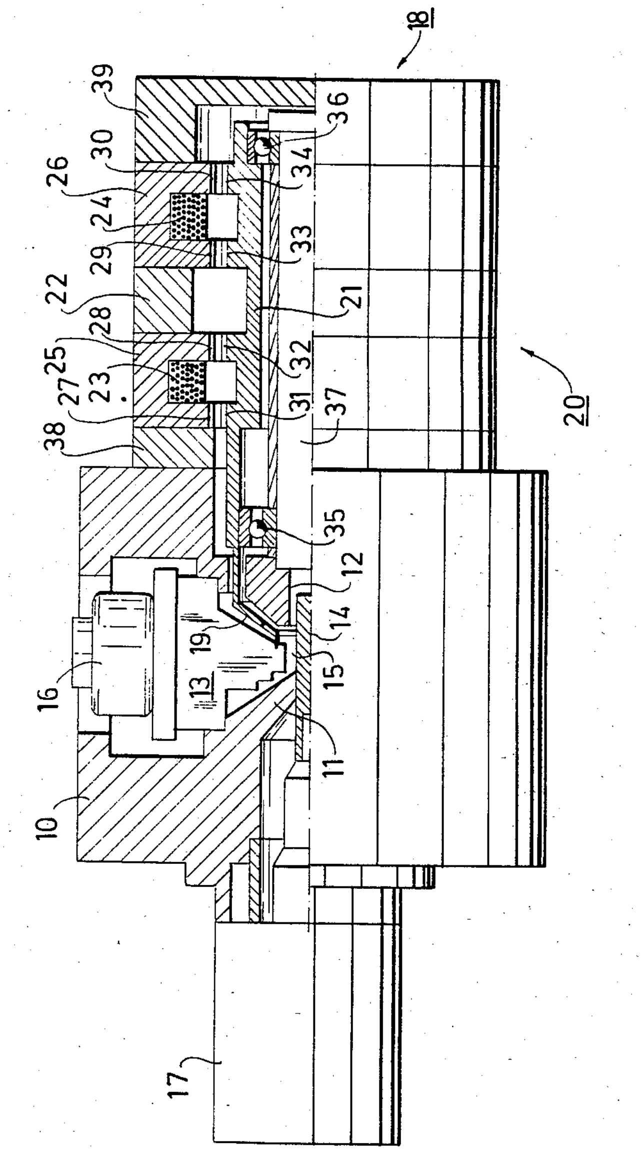
18
39
36
30
34
26
24
33
29
22
21
28
32
25
27
23
31
37
20
38
35
12
14
19
15
16
13
11
10
17

TUNABLE MAGNETRON WITH INTERNAL TUNING MOTOR

BACKGROUND OF THE INVENTION

The invention relates to a tunable magnetron comprising a rotatable tuning body situated in an evacuated chamber connected to the interaction space of the magnetron and having an active part projecting into the tuning cavities of the magnetron for varying the tuning by rotation of the tuning body. The instantaneous angular position of the tuning body determines the tuning frequency of the magnetron and thereby the transmission frequency. An electric motor drives the tuning body.

Such a magnetron is for example described in Swedish patent SE 191.373. The electric motor, which can be a common DC-motor or an AC-motor, is in this case situated outside the vacuum-tight envelope and coupled to the rotatable tuning body via a magnetic coupling, the two parts of which are situated on each side of a vacuum tight wall separating the evacuated chamber from the surroundings.

The most common use of such a magnetron is to let the tuning body rotate continuously for producing a continuous tuning variation with time, and to trigger the magnetron at moments which do not have any connection with the period of the tuning variation, whereby pulses of arbitrarily varying frequency are transmitted. This will improve the resistance against disturbances.

However, under certain circumstances it is desirable to be able to transmit pulses with accurately predetermined frequencies by means of such a magnetron. One example on this is MTI-radar, where movable targets are discriminated by phase comparison between transmitted and incoming signal. In this case usually a number of pulses, for example 7–10 pulses, are transmitted on a given frequency and phase measurements are made, whereafter a rapid jump is made to a new frequency and the phase measurements are repeated on this frequency. A desire then is that the magnetron frequency shall be adjusted to an exact value and that the jump to a new frequency shall occur rapidly. In other measurements a sequence of pulses are transmitted having from pulse to pulse varying frequency, the accuracy of the measurement being determined by the accuracy in the size of the frequency step. Also in this case the magnetron frequency must be adjusted accurately and rapidly.

Previously two fundamentally different solutions of the problem of transmitting fixed predetermined frequencies with such a tunable magnetron have been proposed. In a first case the tuning body rotates continuously at the same time as the instantaneous tuning is continually supervised, for example by means of a local oscillator which is locked to the magnetron and follows the tuning variations. The triggering moment is then controlled such that the desired transmission frequency is always obtained. This solution has the drawback that the accuracy of frequency, which can be reached, will be poor and that the exact time for the triggering cannot be determined in advance.

In another solution, which is for example described in SE patent application 8302434-9 to which co-pending U.S. patent application Ser. No. 601,517, filed Apr. 18, 1984, corresponds, the tuning body cooperates with a mechanical locking device which is activated when the tuning body is rotated in a direction opposite to the normal rotation direction, and then locks the body in an angular position which is determined by a locking shoulder. The tuning frequency then can be adjusted by varying the position of the locking shoulder, for example by means of a setting motor. This solution has the drawback that the construction is expensive and bulky and is slow in adjusting from one frequency to another. Furthermore it suffers from poor precision due to the fact that the low torque gradient of the magnetic coupling gives rise to regulation errors due to friction in the rotor journals.

SUMMARY OF THE INVENTION

The object of the invention is to make an improvement of a magnetron of the kind as described above, by means in which the tuning frequency of the magnetron can be adjusted rapidly and accurately, and which does not suffer from the drawbacks of the previously proposed solutions.

According to the invention the electric motor driving the tuning body is of a type which can be positioned and the motor rotor is situated within the evacuated chamber and is integrated with the tuning body.

By using a motor which can be positioned as the drive motor for the rotatable tuning body, it will be possible to adjust the body to accurately predetermined angular positions, which are entirely determined by the excitation of the motor. Furthermore, due to the fact that the rotor of the drive motor is situated within the vacuum-tight space and is integrated with the tuning body, an accurate step response and capability of rapid switching of the body will be obtained.

By a suitable choice of the motor type according to a preferred embodiment of the invention it is possible to make the rotor of the drive motor and the tuning body in one piece, while the stator part of the motor will form a part of the vacuum-tight envelope of the magnetron. This will result in a very simple and compact construction.

As drive motor any type of motor can be selected, which can be positioned; that is, adjusted to predetermined angular positions. Such motors, which generically can be called position motors, are for example conventional stepping motors, which only can be adjusted to a limited number of predetermined angular positions, but also include other types of motors which can be adjusted to an unlimited number of predetermined positions.

A very suitable position motor of the latter kind is a known motor, which for example is described in an article by B. H. A. Goddijn in Philips Technical note 162, Electronic Components and Applications, volume 3, No. 1, November 1980. This motor has a stator comprising a permanent magnet and a ring-shaped, inwardly open and inwardly toothed magnetic envelope for a ring-shaped coil. The rotor part is made of magnetic material and provided with circumferentially distributed teeth arranged in rows situated opposite the tooth rows on the stator part, the flux path for the permanent magnet being closed through the ring-shaped envelope for the coil and the rotor of magnetic material. Stepping of the rotor to each desired angular position is produced by adjusting the ratio between the torques transferred to the rotor by the respective tooth row as a result of different excitation of the coil.

Besides its great simplicity this known motor construction has the great advantage that the rotor in its whole consists of soft iron, whereby it easily can be integrated with the tuning body.

The invention is illustrated by means of example, with reference to the accompanying drawing.

BRIEF DESCRIPTION OF THE DRAWING

The sole FIGURE is a longitudinal sectional view through a magnetron constructed in accordance with the invention.

DESCRIPTION OF THE PREFERRED EMBODIMENT

The magnetron shown in the drawing, which generally can be of a type as described in SE patent 191.373, consists of a magnetic system 10 with pole shoes 11, 12, an anode system 13 with radially arranged anode plates and a cathode 14. The interaction space 15 of the magnetron is radially limited by the inwardly facing edges of the anode plates and the cathode and axially by the two pole shoes. A magnetic flux is generated axially through the interaction space 15 by permanent magnetic means included in the magnetic system 10 or by external means. At a given place on an envelope included in the magnetic system 10 there is an output 16 coupled to the inner of a cavity in the magnetron.

At one end the magnetron is terminated by a voltage supply part 17, which is not shown in detail, and at the opposite end the magnetron is provided with a tuning unit 18. This unit comprises as active part a rotatable tuning body 19, having an end facing the anode block which projects into the tuning cavities formed between the anode plates via grooves in the rear edge of the anode plates. This part of the tuning body has varying conductivity along its circumference, for example obtained by apertures, a toothed form or the like, for producing a periodic variation of the tuning frequency upon rotation of the body.

According to the invention the tuning body is driven by a position motor 20, the rotor 21 of which is made integral with the tuning body 19. The stator part of the position motor comprises a ring-shaped permanent magnet 22 and two ring-shaped coils 23, 24 each arranged in an inwardly·open, ring-shaped envelope 25, 26 of magnetically conductive material. On the inwardly facing edges the envelopes 25, 26 are provided along the circumference with teeth arranged in rows 27, 28 and 29, 30 respectively. Opposite these tooth rows on the stator, the rotor is provided with teeth arranged in rows 31, 32 and 33,34 having the same distribution as in the stator but with a displacement between the teeth in the different rows on the rotor. The unit consisting of the tuning body and the rotor of the position motor is journalled for rotation by means of two ball bearings 35, 36 arranged on a stationary central shaft 37.

A spacer ring 38 is arranged between the magnetic system 10 of the magnetron and the inner ring-shaped coil envelope 25 of the position motor for separating the two magnetic systems. At the other end of the motor, an end piece 39 is connected to the outer ring-shaped coil envelope 26 of the position motor for closing the open end of the tuning unit. The vacuum-tight envelope, in which a vacuum is maintained in operation, consists of the following parts: the voltage supply 17 and the magnetic system 10 of the magnetron, the spacer ring 38, the coil rings 25, 26, the permanent magnetic ring 22 included in the stator of the position motor, and the end piece 39. Thus, the stator part of the position motor is included as a part of the vacuum-tight envelope of the magnetron, while the rotor of the motor is situated within the evacuated space.

The rotor of the position motor is set to different angular positions by different excitations of the coils 23, 24. When both coils are unexcited the permanent magnet 22 causes a magnetic flux to flow through the stator rings 25, 26 and the rotor 21. The sum of the magnetic fluxes passing through the two opposite tooth rows 27, 31 and 28, 32 is equal to the sum of the magnetic fluxes passing through the tooth rows 29, 30 and 30, 34. The rotor has no preference position.

Now, if the coil 23 is excited in such a direction that the flux through the teeth 27, 31 is increased and the flux through the teeth 28, 32 is decreased the rotor will be set in a position with the teeth in the said first rows opposite each other. If instead the coil 23 is excited such that the flux through the teeth 27, 31 is decreased and the flux through the teeth 28, 32 is increased, then the rotor will be set in a position with the teeth in the said last rows opposite each other. In the same manner the rotor can be bought to assume an angular position with either the teeth in the rows 29, 33 or in the rows 30, 34 opposite each other by different excitation of the coil 24. Thus the motor in this example has four excitation modes, each corresponding to a given angle of the rotor. In one example the angular step from one excitation mode to the next in the sequence is 1.8°. Besides these modes, the rotor can be set in intermediate positions by varying the ratio between the currents in the two coils.

Each angular position of the rotor and the tuning body corresponds to a given tuning frequency of the magnetron. Thus, the tuning frequency can be adjusted to an accurately predetermined value by suitable excitation of the coils. In order to increase the accuracy of the frequency setting, a rapid after-correction of the magnetron frequency can be made in a closed regulation loop containing a frequency discriminator. As a result of the integrated construction of the tuning body and the rotor of the position motor an accurate step response is obtained and setting to a new frequency can be made instantaneously.

In an alternative operation mode it is also possible to produce a continuous periodic variation of the tuning frequency with time by applying a rapid sequence of stepping pulses. As a result of the fact that the drive motor for the tuning body has the shape of a position motor it is then possible, by choosing a suitable program for the control information to the motor, to realize each desired shape of the variation of the tuning frequency with time, for example, a triangular shape.

Instead of the described motor it is also possible to use other types of motors whose rotors do not require a current supply, and which can be positioned, i.e. set into predetermined angular positions. As an example can be mentioned conventional stepping motors, for example such motors containing a rotor with a permanent magnet, "brushless" DC-motors, etc.

What is claimed is:

1. A tunable magnetron, comprising:

a magnetron having an interaction space, a tuning cavity communicating with said space, and an evacuated chamber communicating with said tuning cavity, a rotatable tuning body having an active part projecting into said tuning cavity, arranged such that tuning frequency of the magnetron is a function of the instantaneous angular position of the tuning body, and electric motor means for driving said tuning body, characterized in that said electric motor means comprises a motor having a rotor and a stator, said rotor being situated entirely within said evacuated chamber and integrated with said tuning body, said magnetron comprises a vacuum-tight envelope, said motor stator being fixed with respect to said envelope, and said stator comprises electrical excitation coils, and said rotor is electromagnetically coupled solely by magnetic flux coupling to said stator, said rotor and said stator being arranged such that the relative angular position of the rotor with respect to the stator is entirely determined by electrical excitation of the stator coils, whereby said motor is a position motor and the magnetron frequency is determined entirely by the instantaneous electrical excitation of the coils.

2. A magnetron as claimed in claim 1, characterized in that said stator comprises a permanent magnet, a ring-shaped, inwardly open magnetic envelope having inwardly projecting teeth arranged in stator tooth rows, and a ring-shaped coil, said rotor is made of a magnetic material and has teeth arranged in rows opposite said stator tooth rows, the flux path for said permanent magnet includes said ring-shaped envelope for the coil and said rotor, and movement of the rotor to a desired angular position is produced by adjusting the ratio between torques exerted on the rotor by the respective tooth row as a result of different excitation of the coil.

3. A tunable magnetron, comprising:

a magnetron having an interaction space, a tuning cavity communicating with said space, and an evacuated chamber communicating with said tuning cavity, a rotatable tuning body having an active part projecting into said tuning cavity, arranged such that tuning frequency of the magnetron is a function of the instantaneous angular position of the tuning body, and electric motor means for driving said tuning body, characterized in that said electric motor means comprises a motor having a rotor and a stator, said rotor being situated entirely within said evacuated chamber and being made integral with said tuning body, said magnetron comprises a vacuum-tight envelope, said motor stator forming a part of said envelope, and said stator comprises electrical excitation coils, and said rotor is electromagnetically coupled solely by magnetic flux coupling to said stator, said rotor and said stator being arranged such that the relative angular position of the rotor with respect to the stator is entirely determined by electrical excitation of the stator coils, whereby said motor is a position motor and the magnetron frequency is determined entirely by the instantaneous electrical excitation of the coils.

4. A magnetron as claimed in claim 3, characterized in that said stator comprises a permanent magnet, a ring-shaped, inwardly open magnetic envelope having inwardly projecting teeth arranged in stator tooth rows, and a ring-shaped coil, said rotor is made of a magnetic material and has teeth arranged in rows opposite said stator tooth rows, the flux path for said permanent magnet includes said ring-shaped envelope for the coil and said rotor, and movement of the rotor to a desired angular position is produced by adjusting the ratio between torques exerted on the rotor by the respective tooth row as a result of different excitation of the coil.

* * * * *